United States Patent
Smith

(10) Patent No.: US 10,004,163 B2
(45) Date of Patent: Jun. 19, 2018

(54) INTEGRATED ENVIRONMENTAL CONTROL FOR ELECTRONIC EQUIPMENT ENCLOSURES

(71) Applicant: Oracle International Corporation, Redwood City, CA (US)

(72) Inventor: Frank Smith, Nederland, CO (US)

(73) Assignee: ORACLE AMERICA, INC., Redwood City, CA (US)

(*) Notice: Subject to any disclaimer, the term of this patent is extended or adjusted under 35 U.S.C. 154(b) by 148 days.

(21) Appl. No.: 15/167,747

(22) Filed: May 27, 2016

(65) Prior Publication Data

US 2017/0347496 A1   Nov. 30, 2017

(51) Int. Cl.
| | |
|---|---|
| H05K 7/20 | (2006.01) |
| B03C 3/82 | (2006.01) |
| B03C 3/02 | (2006.01) |
| H05K 9/00 | (2006.01) |
| B03C 3/017 | (2006.01) |

(52) U.S. Cl.
CPC ......... H05K 7/20736 (2013.01); B03C 3/017 (2013.01); B03C 3/02 (2013.01); B03C 3/82 (2013.01); H05K 9/0041 (2013.01)

(58) Field of Classification Search
CPC combination set(s) only.
See application file for complete search history.

(56) References Cited

U.S. PATENT DOCUMENTS

| | | | | |
|---|---|---|---|---|
| 3,446,906 A | * | 5/1969 | Zulauf | H01B 1/00 174/383 |
| 5,431,974 A | * | 7/1995 | Pierce | H05K 9/0041 428/304.4 |
| 5,506,047 A | * | 4/1996 | Hedrick | B32B 5/18 428/307.7 |
| 5,680,294 A | * | 10/1997 | Stora | H05K 7/1457 361/695 |
| 6,171,357 B1 | * | 1/2001 | Guttmann | B01D 46/10 55/385.7 |
| 6,195,493 B1 | * | 2/2001 | Bridges | G02B 6/4452 385/134 |
| 6,552,900 B1 | * | 4/2003 | Hoefer | H05K 7/20181 174/383 |
| 6,610,922 B1 | * | 8/2003 | Twiss | H05K 9/0041 174/390 |

(Continued)

*Primary Examiner* — Robert A Hopkins
*Assistant Examiner* — Sonji Turner
(74) *Attorney, Agent, or Firm* — Marsh Fischmann & Breyfogle LLP; Daniel J. Sherwinter; Kent A. Lembke

(57) ABSTRACT

Embodiments include systems and methods for integrated control of environmental conditions in an equipment enclosure. For example, a novel airflow inlet structure can be installed into a primary airflow path of the equipment enclosure. The airflow inlet structure can include an integrated electrostatic filter sub-structure and an integrated electromagnetic radiation (EMR) control sub-structure. During operation of equipment within the enclosure, air drawn through the equipment enclosure can flow through the primary airflow path in such a way as to flow through the electrostatic filter sub-structure; and the EMR control sub-structure can control EMR emitted by the equipment, such that EMR leaving the enclosure is attenuated to below a threshold level.

20 Claims, 5 Drawing Sheets

(56) References Cited

U.S. PATENT DOCUMENTS

| | | | | |
|---|---|---|---|---|
| 6,680,847 B2 * | 1/2004 | Heard | H05K 9/0041 | 174/382 |
| 6,974,489 B2 * | 12/2005 | Behrens | G06F 1/182 | 174/50 |
| 7,180,738 B2 * | 2/2007 | Mandel | H05K 7/20181 | 361/692 |
| 7,338,547 B2 * | 3/2008 | Johnson | B01D 39/1669 | 174/382 |
| 7,813,121 B2 * | 10/2010 | Bisson | H05K 7/20736 | 361/679.5 |
| 7,839,637 B2 * | 11/2010 | Pakravan | H05K 7/20572 | 165/122 |
| 8,320,121 B2 * | 11/2012 | Bisson | H05K 7/20736 | 361/679.5 |
| 8,737,067 B1 * | 5/2014 | Kim | H05K 7/1492 | 342/175 |
| 9,408,331 B2 * | 8/2016 | Kim | H05K 7/1492 | |
| 9,468,935 B2 * | 10/2016 | Hess | B03C 3/41 | |
| 9,603,289 B1 * | 3/2017 | Shearman | H05K 9/0007 | |
| 2003/0085050 A1 * | 5/2003 | Zarganis | H05K 7/20181 | 174/383 |
| 2003/0192715 A1 * | 10/2003 | Lambert | H05K 9/0041 | 174/355 |
| 2004/0047121 A1 * | 3/2004 | Hope | H05K 9/0049 | 361/679.49 |
| 2005/0132885 A1 * | 6/2005 | Zarganis | H05K 7/20181 | 95/285 |
| 2006/0150599 A1 * | 7/2006 | Johnson | B01D 39/1669 | 55/524 |
| 2007/0095567 A1 * | 5/2007 | Boyce | H05K 9/0041 | 174/383 |
| 2007/0297160 A1 * | 12/2007 | Cochrane | H05K 9/0015 | 361/818 |
| 2009/0190301 A1 * | 7/2009 | Huang | H05K 7/20736 | 361/679.46 |
| 2010/0073901 A1 * | 3/2010 | Suzuki | G06F 1/1616 | 361/829 |
| 2010/0096105 A1 * | 4/2010 | Novotny | H05K 7/20736 | 165/80.2 |
| 2012/0000169 A1 * | 1/2012 | Ahn | B01D 46/10 | 55/383 |
| 2012/0285738 A1 * | 11/2012 | Cochrane | H05K 9/0015 | 174/382 |
| 2013/0074697 A1 * | 3/2013 | Verschoor | H05K 7/20181 | 95/273 |
| 2016/0066469 A1 * | 3/2016 | Salamon | G02B 6/4269 | 361/697 |
| 2016/0135334 A1 * | 5/2016 | Rodriguez | H05K 7/20736 | 165/276 |
| 2016/0215999 A1 * | 7/2016 | Bard | H05K 7/20736 | |
| 2016/0270263 A1 * | 9/2016 | Crawford | H05K 7/20736 | |

* cited by examiner

INTEGRATED ENVIRONMENTAL CONTROL FOR ELECTRONIC EQUIPMENT ENCLOSURES

FIELD

Embodiments relate generally to equipment enclosure environments, and, more particularly, to techniques for integrating environmental control in electronic equipment enclosure environments.

BACKGROUND

Traditionally, data centers have been located in highly controlled spaces because the equipment can be highly sensitive to environmental conditions. For example, such environments typically include systems for controlling temperature, humidity, air quality, etc. Typically, air in such environments is conditioned (e.g., filtered) by a central building heating, ventilating, and air conditioning (HVAC) system and/or by CRACs (Computer Room Air Conditioning units) in the data center. Such environmental control systems can be costly to install and operate. In some cases, operation of environmental controls can be a primary cost driver of a data center operation. However, failing to have such environmental controls can cause particle buildup inside electronics equipment, which can negatively affect performance, reliability, and lifespan of the equipment. As one example, constant cooling is typically involved in reliable long-term operation of data library systems, and such cooling is typically performed by pulling cool air across the data library equipment. Without filtering the air by a building HVAC system and/or CRACs, dust and other particulates can be drawn onto and into the equipment (e.g., tape/hard drive heads, heatsinks, switches, optical sensors), which can cause failures.

BRIEF SUMMARY

Among other things, embodiments provide novel systems and methods for integrated control of environmental conditions in an equipment enclosure. For example, a novel airflow inlet structure can be installed into a primary airflow path of the equipment enclosure, the airflow inlet structure having an integrated electrostatic filter sub-structure and an integrated electromagnetic radiation (EMR) control sub-structure. The airflow inlet structure can be installed into a wall panel of the equipment enclosure. During operation of equipment within the enclosure, air drawn through the equipment enclosure can flow through the primary airflow path in such a way as to flow through the electrostatic filter sub-structure; and the EMR control sub-structure can control EMR emitted by the equipment, such that EMR leaving the enclosure is attenuated to below a threshold level.

According to one set of embodiments, a data storage library system is provided having integrated environmental control structure. The system includes: a data storage library enclosure operable to supply equipment disposed therein with a direct current (DC) power supply; an airflow outlet structure through which air is drawn out from the enclosure; and an airflow inlet structure having an EMR control sub-structure and an electrostatic filter sub-structure electrically coupled with the DC power supply. A primary airflow path through the enclosure is defined by the air being drawn through the airflow inlet structure and the airflow outlet structure.

According to another set of embodiments, an environmental control system for an electronic component system disposed in an enclosure is provided. The system includes an airflow inlet structure having an EMR control sub-structure and an electrostatic filter sub-structure. The electrostatic filter sub-structure is powered by a DC power supply. The airflow inlet structure is insertable into a primary airflow path of the enclosure, such that air is drawn into the enclosure through the EMR control sub-structure and the electrostatic sub-structure and such that the EMR leaving the enclosure is attenuated to below a threshold level by the EMR control sub-structure.

According to another set of embodiments, a method is provided for controlling environmental conditions in an equipment enclosure. The method includes: integrating an EMR control sub-structure with an airflow inlet structure; integrating an electrostatic filter sub-structure with an airflow inlet structure; installing the airflow inlet structure in a primary airflow path of the equipment enclosure; and drawing air through the equipment enclosure through the primary airflow path, such that the air is drawn into the enclosure through the EMR control sub-structure and the electrostatic filter sub-structure and that EMR leaving the enclosure is attenuated to below a threshold level by the EMR control sub-structure.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

In the following description, numerous specific details are set forth to provide a thorough understanding of the present invention. However, one having ordinary skill in the art should recognize that the invention may be practiced without these specific details. In some instances, structures, and techniques have not been shown in detail to avoid obscuring the present invention.

Figure 1A:
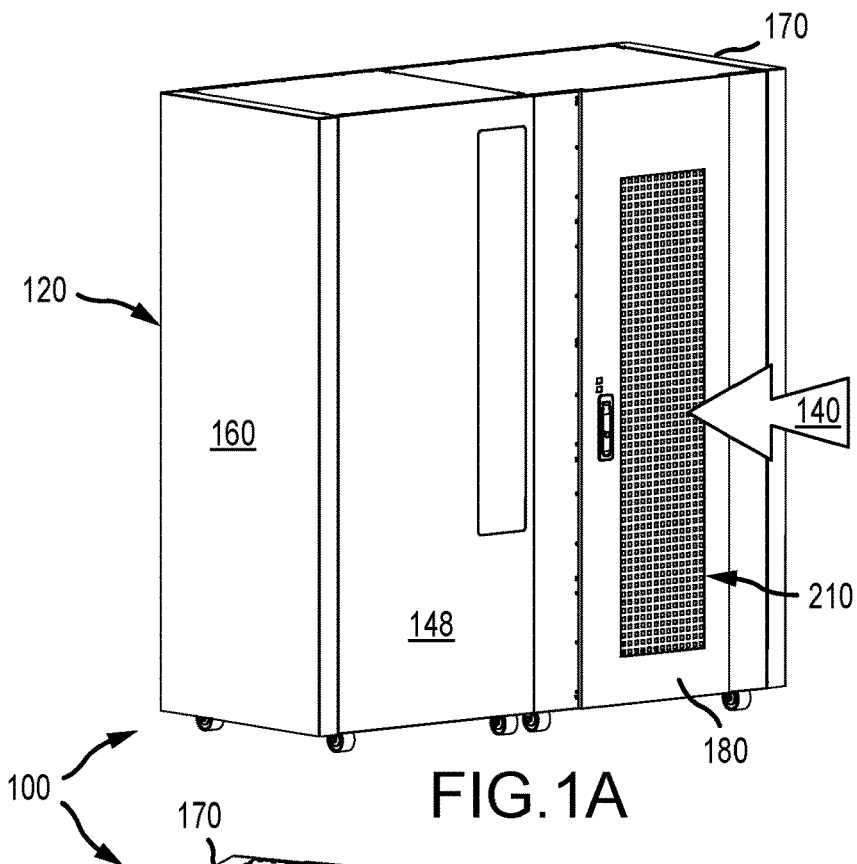
FIGS. 1A and 1B show an illustrative data storage library system having integrated environmental control system, according to various embodiments.
Figure 1B:
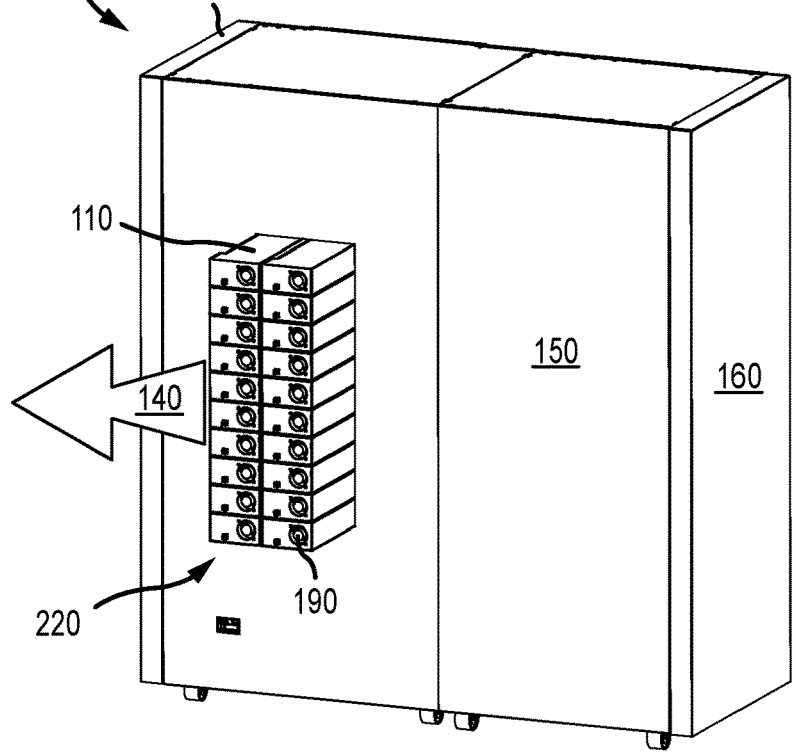

Turning first to FIGS. 1A and 1B, an illustrative electronic component system 100 is shown disposed in an enclosure, according to various embodiments. The electronic component system 100 is shown as a type of data storage library having multiple storage media and media drives. While a data storage library system is shown, embodiments described herein can apply in context of any suitable electronic system disposed in an enclosure, including, but not limited to, any suitable type of data storage library system. The illustrated data storage library system includes a number of storage media (not shown) that have data stored thereon, and media drives 110 for reading and/or writing to the storage media. The storage media and media drives 110 are physically disposed within an enclosure 120 and are designed to operate in a cooled environment. During operation, components of the library can generate a large amount of heat. Accordingly, proper (e.g., reliable, long-term) operation of the library can involve cooling the enclosure 120, for example, by drawing cool air through the enclosure 120, to regulate the temperature of the media drives 110 and any other electronic components disposed therein.

Such enclosures 120 typically have a front panel 148, a back panel 150, and side panels 160, 170. Each of the panels can be implemented in any suitable manner. For example, one panel may include two or more sub-panels, multiple panels may be manufactured as a single panel, etc. Further, some or all panels can be solid (i.e., without openings) or can include any suitable number and/or type of openings, such as vents. One or more panels can provide access to the enclosure as an access panel 180, for example, via a hinged door, a removable sub-panel, etc. In the illustrated embodiment, the front panel 148 includes two sub-panels, one coupled to the enclosure 120 by hinges to manifest an access panel 180 door, and the other coupled to the enclosure 120 to manifest a fixed wall panel. Alternatively, the access panel 180 can be slideably coupled with the enclosure 120. For example, one or more other panels or structural features of the enclosure 120 can have rails or features adapted to receive the access panel 180.

Some conventional approaches to cooling of electronic equipment disposed in enclosures involve building-wide and/or room-wide cooling and filtering of air (using HVAC and/or CRAC systems, as described above). The cooled and conditioned air can then be drawn across (and through, in some cases) the equipment through passive (e.g., openings) and or active (e.g., fans) airflow elements. While such systems can be effective, they can also be extremely costly and inefficient.

Accordingly, embodiments are described herein for integrating environmental control functions into the enclosure 120 itself. To facilitate sufficient cooling of electronic equipment (e.g., storage media, media drives 110, etc.) disposed in the enclosure 120, embodiments of the electronic component system 100 can have an airflow inlet structure 210 and an airflow outlet structure 220 that define a primary airflow path (illustrated by arrow 140). For example, the panels of the enclosure 120 can appreciably limit the airflow through paths other than the primary airflow path. In some conventional environments, such limits can undesirably frustrate the flow of conditioned air (coming from HVAC and/or CRAC systems) across the components. In embodiments described herein, however, establishing the primary airflow path can help ensure that the air flowing through the enclosure 120 has passed through integrated environmental controls of the enclosure 120 (e.g., as other air entering the enclosure may not be properly conditioned). Embodiments of the airflow outlet structure 220 can operate to pull air out from the enclosure 120. For example, one or more fans 190 can be used to draw the air out of the enclosure 120. The airflow outlet structure 220 can include openings, fan(s) 190, etc. disposed in relation to any suitable panel of the enclosure 120 (e.g., typically a rear panel 150). In some embodiments, some or all of the airflow outlet structure 220 is implemented by the electronic equipment disposed in the enclosure 120. For example, some or all equipment in the enclosure 120 can include fans 190 and vents for drawing air heated by the equipment away from the equipment. In some implementations, sufficient airflow can be achieved passively, for example, without fans 190, or the like. Embodiments of the airflow inlet structure 210 operate to draw air into the enclosure 120 via the primary airflow path 140. For example, the air can be drawn through the airflow inlet structure 210 and into the enclosure 120 in response to negative pressure within the enclosure 120 created by the fans 190, or in any other suitable manner. Alternatively or additionally, one or more fan(s) 190 can be part of the airflow inlet structure 210 to draw air into the enclosure 120.

Embodiments described herein seek to improve the reliability of electronic component systems 100 by integrating environmental control structure into the system 100. As described herein, novel airflow inlet structures 210 can be installed into a primary airflow path 140 of the equipment enclosure 120. Embodiments of the airflow inlet structure 210 can include an integrated electrostatic filter sub-structure 240 and an integrated electromagnetic radiation (EMR) control sub-structure 230. During operation of equipment within the enclosure 120, air drawn through the equipment enclosure 120 can flow through the primary airflow path 140 in such a way as to flow through the electrostatic filter sub-structure 240; and EMR emitted by the equipment can be controlled by the EMR control sub-structure 230, such that EMR leaving the enclosure is attenuated to below a threshold level. For example, EMR is emitted by electronic equipment during operation, and EMR above a certain level can cause interference with other equipment in the space in which it is installed. Accordingly, certain regulations (e.g., by governmental agencies, private regulatory agencies, data centers, etc.) have established threshold levels for EMR.

Figure 2:
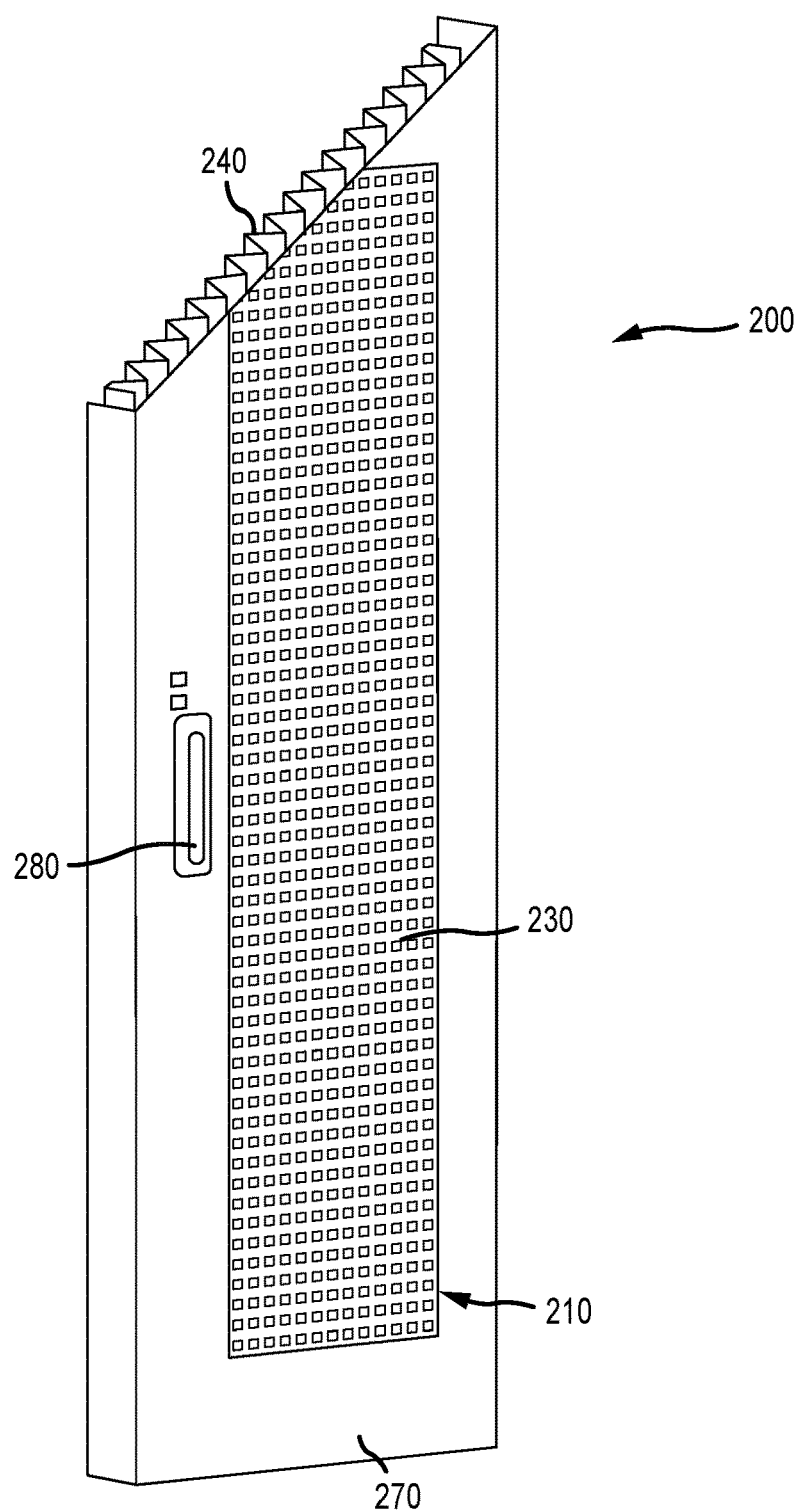
FIG. 2 shows a partial cross-section isometric view of an environmental control system for an electronic component system disposed in an enclosure, according to various embodiments.

FIG. 2 shows a partial cross-section isometric view of an environmental control system 200 for integration into an electronic component system disposed in an enclosure 120, according to various embodiments. The environmental control system 200 includes an airflow inlet structure 210 having an EMR control substructure 230 and an electrostatic filter sub-structure 240. Embodiments of the electrostatic filter sub-structure 240 can be electrically coupled with a DC power supply (not shown). Further, the environmental control system 200 can be integrated into a panel 270 (e.g., front panel 148 of the enclosure 120 of FIGS. 1A and 1B). For example, panel 270 may be an access panel, such as access panel 180 of FIGS. 1A and 1B. The panel 270 can be integrated into an equipment enclosure using hinges (e.g., as a door) and a securement device 280 (e.g., latch or knob), using a track (e.g., to facilitate sliding the panel into and out of the enclosure), by mechanical fasteners, by magnets, and/or in any other suitable manner. In some implementations, the panel 270 is an access control door, and the securement device 280 is a lockable latch and/or other structure to limit enclosure access only to certain individuals, at certain times, etc. Such implementations can help protect individuals from physical harm, can help protect equipment in the enclosure (e.g., data storage media, sensitive equipment, etc.) from damage and/or unauthorized access, etc.

Embodiments of the integrated EMR control substructure 230 can include an EMR shield panel. In some implementations, the EMR shield panel can have a plurality of perforations operable to attenuate the EMR of the electronic equipment disposed within the enclosure 120 to below a threshold level. For example, the array of perforations can include any suitable number and arrangement of elliptical through-holes and/or through-holes of any other suitable shape. In other implementations, the EMR control sub-structure 230 can include a mesh, lattice, or other structure that manifests apertures sized, shaped, and/or otherwise arranged to attenuate EMR to below the threshold EMR level. The EMR control sub-structure 230 can include multiple layers. For example, one layer can include drilled through-holes, and a second layer can include a mesh, such that the two layers combine to attenuate the EMR emitted from the enclosure. In some embodiments, the EMR control sub-structure 230 can perform active EMR attenuation, such as by including active EMR canceling components. Embodiments of the EMR control sub-structure 230 can include any suitable components for attenuating EMR radiated from components in the enclosure to below a predetermined threshold level.

The electrostatic filter sub-structure 240 can include several layers. One of the layers can include ionized wires (e.g., an open mesh screen) electrically chargeable by the DC power supply. As such, when dust particles suspended in the air (the air traveling along primary airflow path 140 of FIG. 1) are drawn through the electrostatic filter sub-structure 240, the electrostatic filter sub-structure 240 can charge (ionize) the unfiltered air and the particulates (e.g., dust, pollen, metal) carried thereby with a small positive charge. The air can be drawn through a layer of the electrostatic filter sub-structure 240 consisting of metal plates that create a negatively charged electrical field. The positively charged particulates, being attracted to the negatively charged plates, can be collected on the metal plate layer(s), thereby removing the particulates from the air and allowing filtered air to pass through. In some implementations, the metal plate layer(s) can be implemented in a manner that facilitates cleaning. For example, some or all layers of the electrostatic filter sub-structure 240 can be disconnected from power, removed, and washed; subsequently being dried, reinstalled, and reconnected to power. Additional layers can be incorporated into the electrostatic filter sub-structure 240. For instance, a preliminary filter can be included on an outermost layer of the electrostatic filter sub-structure 240. The preliminary filter can be used to catch larger particulates in the air entering the enclosure through the primary airflow path 140. The electrostatic filter sub-structure 240 can also include an end filter for additional air purification. For instance, an activated carbon filter or any other suitable end filter can be used.

The EMR control sub-structure 230 and the electrostatic filter sub-structure 240 can be integrated with each other and/or with the panel 270 in any suitable manner. In some embodiments, the panel 270 is integrated with the EMR control sub-structure 230, and the electrostatic filter sub-structure 240 is removably integrated therein. In one such embodiment, the EMR control sub-structure 230 is integrated with the panel 270 by the panel 270 having the EMR control sub-structure 230 formed thereon (e.g., as perforations drilled into a region of the panel 270). In another such embodiment, the panel 270 is formed with a large cutout region, and the EMR control sub-structure 230 is integrated with the panel 270 as a sub-panel (e.g., having holes drilled therein, formed by a mesh, etc.) adapted to be coupled with the panel 270 using welding, mechanical fasteners, magnets, and/or any in any other suitable manner. In such embodiments, the panel 270 can include interface structure for removably receiving the electrostatic filter sub-structure 240. For example, the electrostatic filter sub-structure 240 can be formed as a sub-panel structure that can be slid into a C-channel, or the like, thereby integrating the electrostatic filter sub-structure 240 with the panel 270. Alternatively, the electrostatic filter sub-structure 240 can be coupled to the panel 270 and/or the EMR control sub-structure 230 using magnetic, mechanical, and/or other fasteners. Such embodiments can facilitate removal of the electrostatic filter sub-structure 240, for example, for replacement and/or cleaning, without removing the panel 270 from the enclosure.

In other embodiments, the EMR control sub-structure 230 and the electrostatic filter sub-structure 240 can be integrated as an environmental control sub-panel, which can then be integrated into the panel 270. In one such embodiment, one or more panels (e.g., of perforations, mesh, etc.) can be designed to have apertures sized and/or charged to operate both as one or more layers of the electrostatic filter sub-structure 240 and as one or more EMR attenuation layers of the EMR control sub-structure 230. In such an embodiment, the panel 270 can include cut-outs, receiving structures, and/or any other suitable features for integrating the combined EMR control sub-structure 230 and electrostatic filter sub-structure 240 as an airflow inlet structure 210 of the panel 270. In another such embodiment, the electrostatic filter sub-structure 240 can be enclosed within a housing having one or more sides that include apertures sized and/or arranged to operate as the EMR control sub-structure 230. Alternatively, the EMR control sub-structure 230 can be implemented as one or more plates coupled to one or more sides of the electrostatic filter sub-structure 240 to form an integrated environmental control sub-panel.

As described above, the various implementations of the EMR control sub-structure 230 and the electrostatic filter sub-structure 240 can be integrated with the panel 270 in any suitable manner to form the airflow inlet structure 210. The panel 270 with integrated airflow inlet structure 210 can be integrated with the enclosure in any suitable manner that produces an inlet for the primary airflow path 140 through the enclosure. In this way, the apertures of the EMR control sub-structure 230 and the features of the electrostatic filter sub-structure 240 can be arranged to draw filtered air into the enclosure 120 and to attenuate EMR leaving the enclosure.

Figure 3:
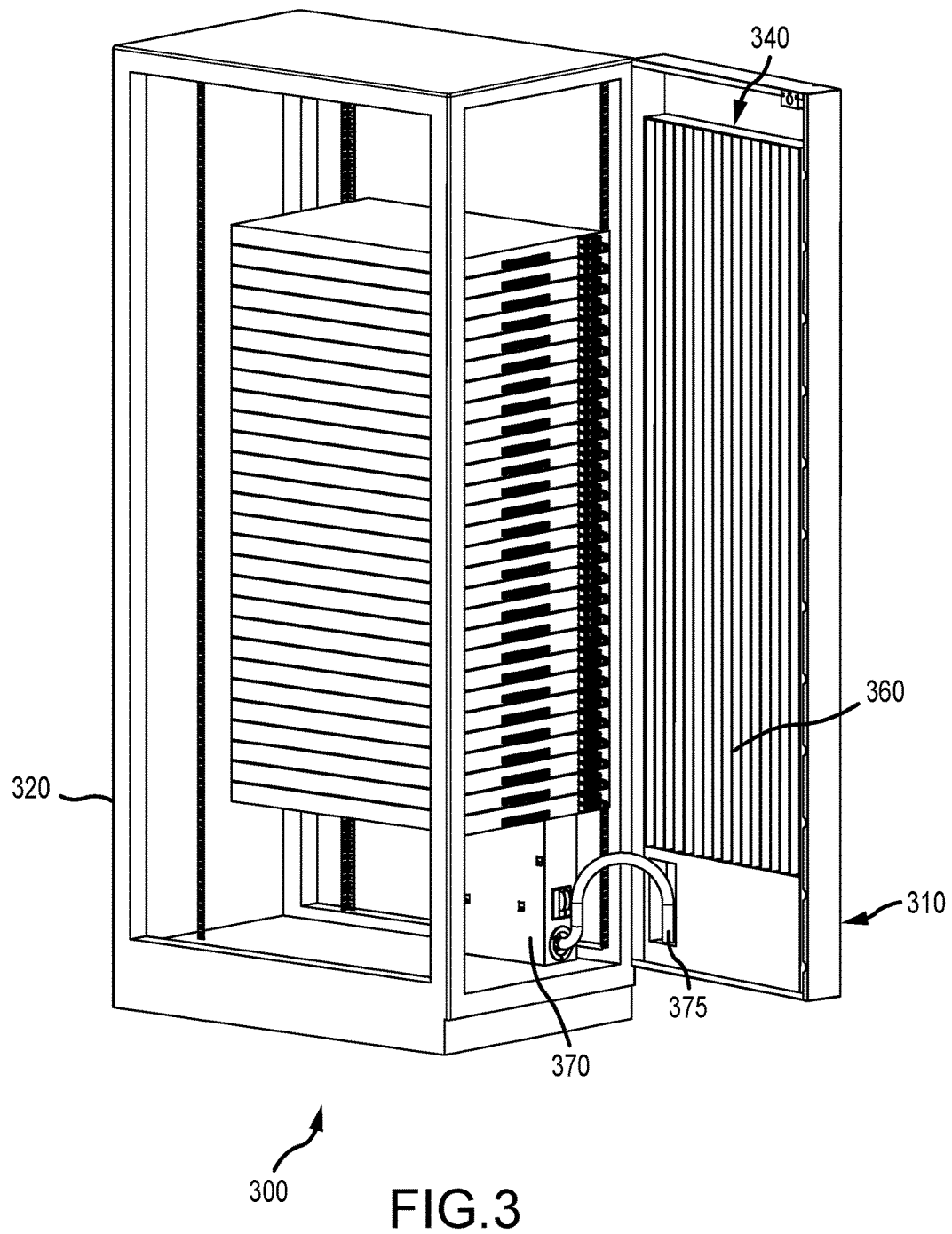
FIG. 3 shows an isometric view of an enclosure with a side panel removed having an integrated environmental control system, according to various embodiments.

FIG. 3 shows an isometric view of an enclosure 300 with a panel having an integrated environmental control system, according to various embodiments. In some embodiments, the integrated environmental control system can be implemented as described above with reference to FIG. 2. The enclosure 300 can be any electronic equipment rack having electronic equipment installed therein. For example, the enclosure 300 can house data library equipment (e.g., storage media, media drives, etc.), data processing equipment (e.g., blade servers, telecommunication links, etc.), or any other electronic equipment. Some embodiments further include a direct current (DC) power supply 370 disposed therein. An interior space of the enclosure 300 generally can be defined by a front panel 310, a back panel 320, and side panels (removed to more clearly show the interior space of the enclosure 300).

As illustrated, an airflow inlet structure 340 can be inserted into a wall panel of the enclosure. As depicted, the airflow inlet structure 340 can be integrated into the front panel 310 of the enclosure 300. A primary airflow path of the enclosure can be defined by the front panel 310 and the back panel 320, or in any other suitable manner, such that the primary airflow path enters the enclosure 300 through the airflow inlet structure 340. For example, such enclosures 300 can be part of a data center, data library, and/or other system, in which multiple such enclosures 300 are placed next to each other with their respective front panels 310 collectively defining a primary airflow inlet region for the multiple enclosures 300. In such an environment, air can be drawn through the airflow inlet structures 340 of the enclosures 300 to cool the electronic equipment disposed therein. In some such environments, one or more of the enclosures 300 having one or more enclosures 300 adjacent thereto can be implemented without side panels, so that multiple enclosures operate collectively to define an interior space. In such implementations, one or more of the enclosures 300 contributing to the collective interior space can be implemented without an airflow inlet structure 340 (e.g., one airflow inlet structure can be adapted to provide filtering, EMR attenuation, and/or cooling to multiple enclosures 300). As described above, enclosure 300 embodiments, and/or the equipment installed therein, can also include one or more fans and/or any other suitable components for assisting with drawing air through the enclosure 300 (e.g., and out through the back panel 320 of the enclosure 300).

As illustrated, and as described above, the airflow inlet structure 340 can include an EMR control sub-structure 350 and an electrostatic filter sub-structure 360. The sub-structures of the airflow inlet structure 340 can be integrated with each other in any suitable manner, for example, as described with reference to FIG. 2. Further, the airflow inlet structure 340 can be integrated with the front panel 310 in any suitable manner, for example, as described with reference to FIG. 2. Embodiments of the EMR control sub-structure 350 can include apertures adapted (e.g., sized, shaped, arranged, etc.) to attenuate the EMR radiated by the electronic equipment disposed in the enclosure 300 to below a predetermined threshold level. Embodiments of the electrostatic filter sub-structure 360 can be coupled with the DC power supply 370 to electrostatically filter the air entering the enclosure 300 through the primary airflow path.

In some embodiments, the DC power supply 370 can be integrated with and housed within the enclosure 300 (e.g., as illustrated). For example, the DC power supply 370 can be a DC rectifier that is coupled with wall power or any other suitable AC power source; or the DC power supply 370 can be (or can include) a generator. In other embodiments, the DC power supply 370 can be external to the enclosure 300 and can include a cable and/or other power coupling for electrically coupling the DC power supply 370 with the electrostatic filter sub-structure 360. For example, a DC power cable can enter the enclosure from a floor port, a wall port, another enclosure, etc.

Figure 4:
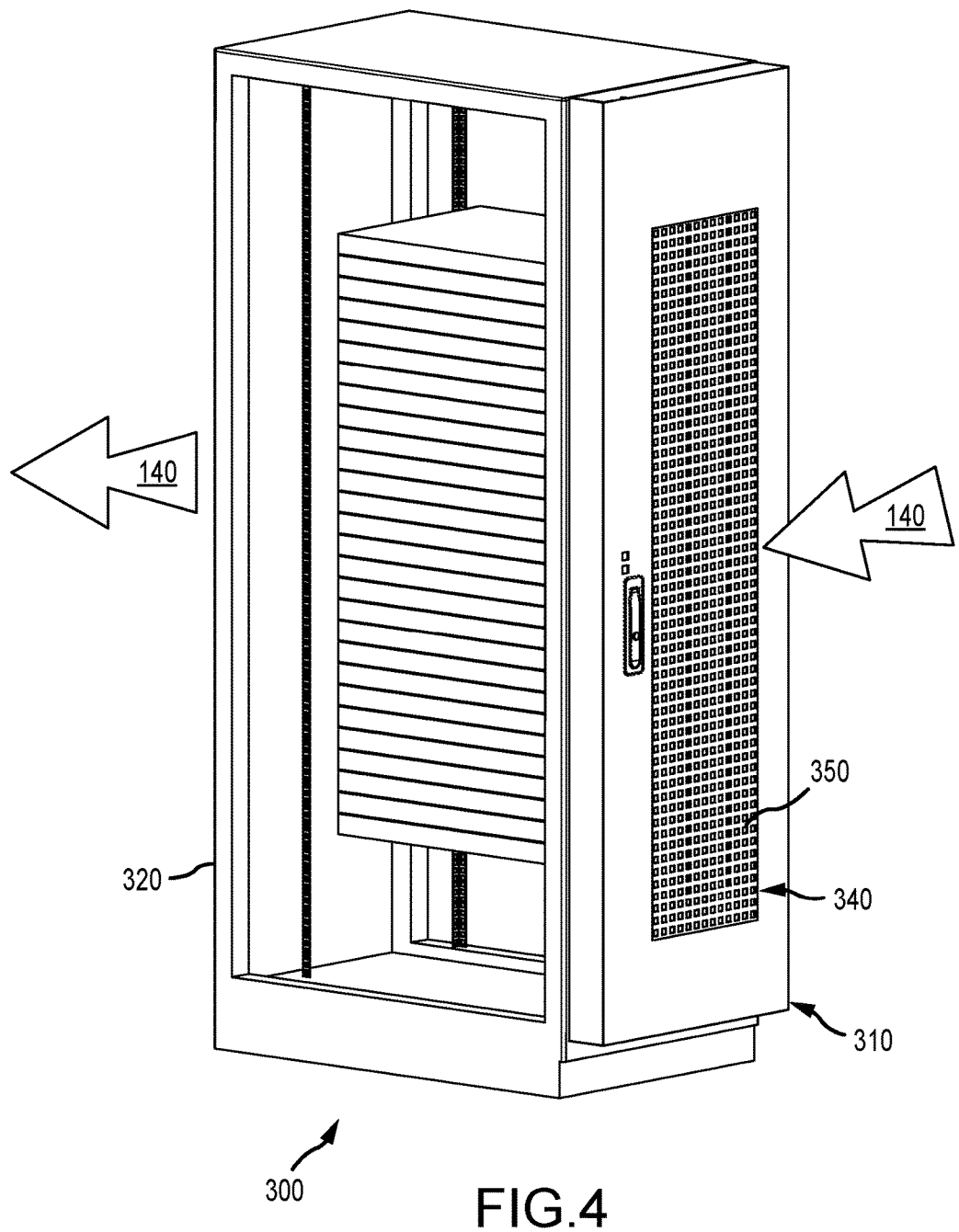
FIG. 4 shows another isometric view of an enclosure with a side panel removed having an integrated environmental control system, according to various embodiments.

FIG. 4 shows another isometric view of the enclosure 300 of FIG. 3, according to various embodiments. In FIG. 4, the front panel 310 is illustrated as a closed access panel (e.g., a door). As described above, the access panel can be implemented as a door (e.g., coupled with the enclosure 300 using hinges, or the like), as a removable panel (coupled with the enclosure 300 using magnetic, mechanical, and/or other fasteners), and/or in any other suitable manner. As illustrated, the front panel 310 has an integrated airflow inlet structure 340 that includes an electrostatic filter sub-structure (not shown) and an EMR control sub-structure 350. A primary airflow path 140 is shown as entering the enclosure 300 through the airflow inlet structure 340 of the front panel 310 and exiting the enclosure 300 through the back panel 320.

Figure 5:
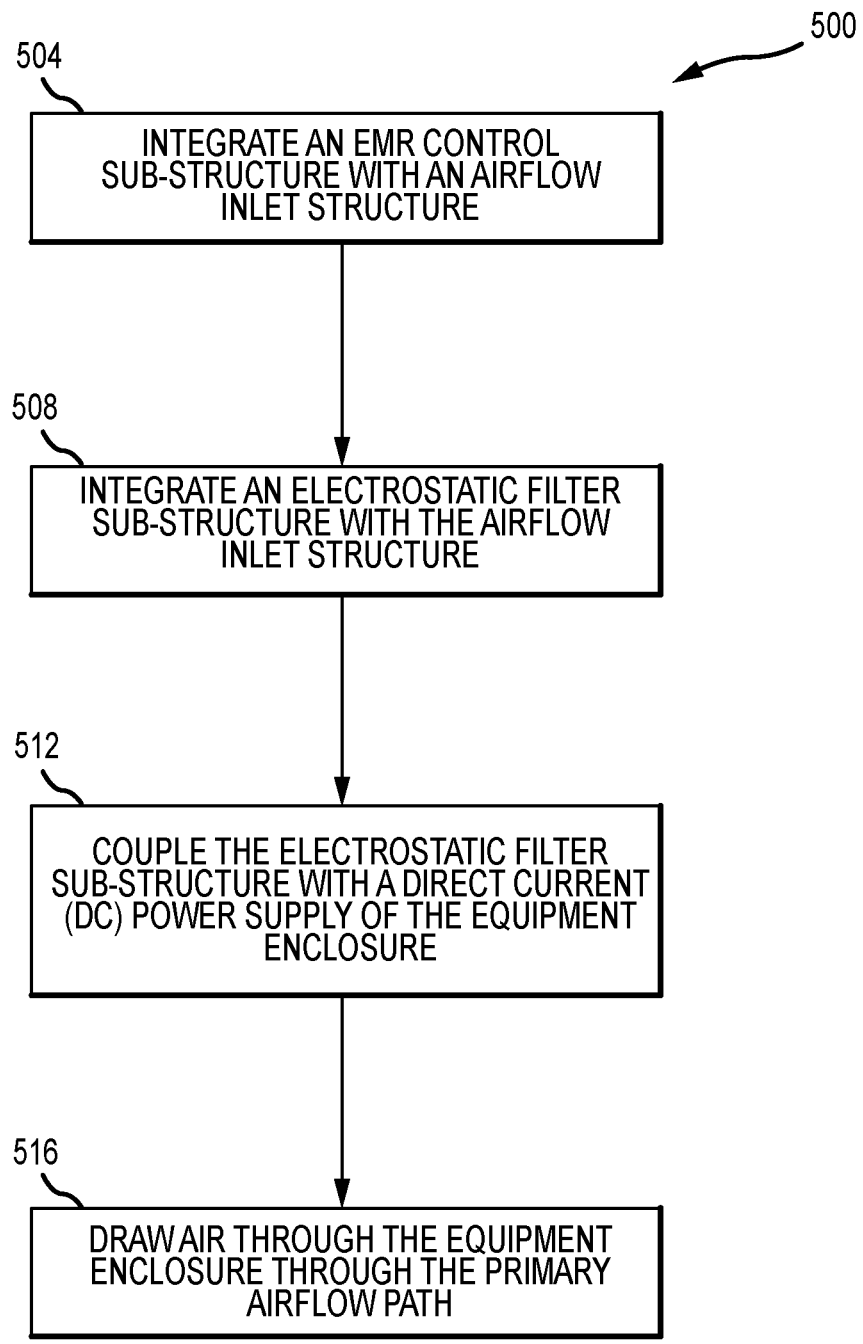
FIG. 5 shows a flow diagram of an illustrative method for controlling environmental conditions in an equipment enclosure, according to various embodiments.

FIG. 5 shows a flow diagram of an illustrative method 500 for controlling environmental conditions in an equipment enclosure, according to various embodiments. Some embodiments of the method 500 can operate in context of the systems described above with reference to FIGS. 1-4. Embodiments of the method 500 can begin at stage 504 by integrating an EMR control sub-structure with an airflow inlet structure. For example, as discussed above, the EMR control sub-structure can include an EMR shield panel having multiple apertures (e.g., perforations, mesh, and/or any other suitable shape(s), size(s), and arrangement(s) of through-holes). In some instances, integrating the EMR control sub-structure into the airflow inlet structure can include drilling an array of through-holes in a wall panel. Alternatively, a separate layer can be secured to the wall panel in any other suitable way (e.g., mechanical fastener, slot, etc.). The apertures of the EMR control sub-structure can be configured with respect to one or more primary frequencies of EMR expected to be radiated by electronics equipment housed in the enclosure. For example, apertures of the EMR control sub-structure can be sized large enough (and/or in particular arrangements and/or quantities) to permit a sufficient volume of air to enter the enclosure, while being sized relative to wavelengths of one or more expected EMR frequencies to effectively attenuate those EMR frequencies from radiating out of the enclosure.

At stage 508, embodiments can integrate the electrostatic filter sub-structure with the airflow inlet structure. For example, as described above, the electrostatic filter sub-structure can be integrated with the airflow inlet structure (e.g., in a wall panel, or the like). In some implementations, the electrostatic filter sub-structure can be removably integrated into the wall panel by a set of mechanical fasteners (e.g., wing nuts, or the like). Alternatively, the electrostatic filter sub-structure can be integrated into the wall panel by a hinged or sliding support interface. For example, the wall panel may have "L" or "C" brackets, latches, etc. sized to receive the electrostatic filter. Alternatively a slot or a latch type securement device may be used.

In some embodiments the EMR control sub-structure (e.g., EMR shield panel) and the electrostatic filter sub-structure (e.g., electrostatic filter) can be coupled together to form an environmental control assembly (e.g., sub-panel). The environmental control assembly can be removably integratable with the wall panel via a support interface, so that, when integrated, at least a portion of the plurality of perforations are aligned with the electrostatic filter and the opening to draw the air into the enclosure through the opening, the perforations, and the electrostatic filter. In other embodiments, the EMR control sub-structure can be integrated into the airflow inlet structure and the wall panel by drilling elliptical perforations into an array of the wall panel. The electrostatic filter sub-structure can then be mechanically fastened or otherwise to the wall panel as discussed just above.

At stage 512, embodiments can couple the electrostatic filter sub-structure with a DC power supply of the equipment enclosure. For example, as described above, the DC power supply can include a rectifier, power cable, power connector, and/or any other suitable components disposed in the enclosure 120. Alternatively, the DC power supply, coupleable with the electrostatic filter can be fed up through a raised floor structure. In some instances the DC power supply and the electrostatic filter sub-structure can be coupled with a cylindrical male-female connector. Alternatively a snap and lock, Molex, or any other suitable DC-type connector can be used to couple the electrostatic filter sub-structure and the DC power supply. In some instances, the electrostatic filter sub-structure coupler can be coupleable to a cable integrated into the airflow inlet structure. In such a case, the cable integrated into the airflow inlet structure can be coupled to the DC power supply.

At stage 516, embodiments can draw air through the equipment enclosure through the primary airflow path subsequent to the airflow inlet panel being integrated into the enclosure and establishing the primary airflow path. For example, air can be passively drawn through the primary airflow path, actively drawn through the airflow path by fans and/or other components external to the enclosure, and/or actively drawn through the primary airflow path by activating components of the enclosure (e.g., powering on fans and/or other components in a rear panel of the enclosure, in electronics equipment mounted within the enclosure, etc.). During operation of electronics equipment in the enclosure, air is drawn through the airflow inlet path and is filtered by the electrostatic filter sub-structure and circulated through the enclosure; and the EMR control sub-structure attenuates the EMR radiating from the electronic equipment to limit the level exiting the enclosure to below a threshold level.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

Other examples and implementations are within the scope and spirit of the disclosure and appended claims. For example, the airflow inlet structure and the airflow outlet structure may be integrated into the same panel of an enclosure. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A data storage library system having integrated environmental control structure, the system comprising:
   an enclosure, having disposed therein, a plurality of storage media, a plurality of media drives, and a direct current (DC) power supply, the enclosure comprising:
   an airflow outlet structure through which air is drawn out from the enclosure; and
   an airflow inlet structure through which the air is drawn into the enclosure, the airflow inlet structure having an electromagnetic radiation (EMR) control sub-structure and an electrostatic filter sub-structure, the electrostatic filter sub-structure electrically coupled with the DC power supply,
   wherein the airflow inlet structure and the airflow outlet structure define a primary airflow path through the enclosure, for the air filtered by the electrostatic filter sub-structure,
   wherein the electrostatic filter sub-structure charges particulates in the air drawn into the enclosure via the airflow inlet structure with a positive charge and comprises a layer creating a negatively charged electrical field, whereby the particulates with the positive charge are attracted to, and collected by, the layer prior to entering the enclosure.

2. The data storage library system of claim 1, wherein the airflow inlet structure comprises:
   a wall panel of the enclosure,
   wherein the electrostatic filter sub-structure is integral with the wall panel, and the EMIR control sub-structure comprises a plurality of perforations that are positioned to draw the air into the enclosure through the electrostatic filter sub-structure and are sized to attenuate EMR leaving the enclosure to below a threshold level.

3. The data storage library system of claim 2, wherein:
   the electrostatic filter substructure further comprises a support interface coupled to the wall panel; and
   an electrostatic filter, wherein the electrostatic filter sub-structure is integral with the wall panel by removably integrating the electrostatic filter with the support interface.

4. The data storage library system of claim 3, wherein:
   the wall panel comprises an opening;
   the EMR control sub-structure comprises an EMR shield panel having the plurality of perforations;
   the EMR shield panel is coupled with the electrostatic filter to form a filter assembly; and
   the filter assembly is removably integrated with the wall panel via the support interface, wherein, when integrated, at least a portion of the plurality of perforations are aligned with the electrostatic filter and the opening to draw the air into the enclosure through the opening, the perforations, and the electrostatic filter.

5. The data storage library system of claim 2, wherein:
   the electrostatic filter sub-structure is integral into the wall panel, and
   the wall panel is removably coupled with the enclosure.

6. The data storage library system of claim 2, wherein:
   the electrostatic filter sub-structure is integral into the wall panel by a set of mechanical fasteners.

7. The data storage library system of claim 2, wherein the wall panel is coupled with the enclosure via a hinge to form an access door, and the wall panel comprises a lockable securement device by which to protect the enclosure from unauthorized access.

8. The data storage library system of claim 2, wherein at least a portion of the perforations is formed by an array of elliptical through-holes.

9. The data storage library system of claim 2, wherein at least a portion of the perforations is formed by a mesh.

10. The data storage library system of claim 1, wherein the airflow outlet structure comprises a fan that draws the air out from the enclosure.

11. The data storage library system of claim 1, wherein the EMR control sub-structure comprises an active attenuation subsystem to actively attenuate the EMR leaving the enclosure to below a threshold level.

12. The data storage library system of claim 1, wherein the DC power supply further comprises an enclosure mounted rectifier electrically coupled with an alternating current (AC) power supply.

13. The data storage library system of claim 1, wherein the electrostatic filter sub-structure comprises a cable having a connector that electrically couples with the DC power supply.

14. The data storage library system of claim 1, wherein the DC power supply comprises a cable having a connector that electrically couples with the electrostatic filter sub-structure.

15. A data storage library system having integrated environmental control structure, comprising:
- an enclosure, having disposed therein a plurality of media drives and a direct current (DC) power supply;
- an airflow outlet structure through which air is drawn out from the enclosure; and
- an airflow inlet structure through which the air is drawn into the enclosure, the airflow inlet structure having an electromagnetic radiation (EMR) control sub-structure and an electrostatic filter sub-structure, the electrostatic filter sub-structure being electrically coupled with the DC power supply,
- wherein the airflow inlet structure and the airflow outlet structure define a primary airflow path through the enclosure for air filtered by the electrostatic filter sub-structure,
- wherein the airflow inlet structure comprises a wall panel of the enclosure, and
- wherein the electrostatic filter sub-structure is integral with the wall panel, and the EMR control sub-structure comprises a plurality of perforations that are positioned to draw the air into the enclosure through the EMR control sub-structure and then through the electrostatic filter sub-structure.

16. The data storage library system of claim 15,
wherein the electrostatic filter substructure further comprises a support interface coupled to the wall panel and an electrostatic filter,
wherein the electrostatic filter sub-structure is integral with the wall panel by removably integrating the electrostatic filter with the support interface,
wherein the wall panel comprises an opening, wherein the EMR control sub-structure comprises an EMR shield panel having the plurality of perforations,
wherein the EMR shield panel is coupled with the electrostatic filter to form a filter assembly,
wherein the filter assembly is removably integrated with the wall panel via the support interface;
wherein, when integrated, at least a portion of the plurality of perforations are aligned with the electrostatic filter and the opening to draw the air into the enclosure through the opening, the perforations, and the electrostatic filter.

17. The data storage library system of claim 15, wherein at least a portion of the perforations is formed by an array of elliptical through-holes, wherein the airflow outlet structure comprises a fan that draws the air out from the enclosure, and wherein the EMR control sub-structure comprises an active attenuation subsystem to actively attenuate the EMR leaving the enclosure to below a threshold level.

18. The data storage library system of claim 15, wherein the DC power supply further comprises an enclosure mounted rectifier electrically coupled with an alternating current (AC) power supply.

19. A data storage library system having integrated environmental control structure, the system comprising:
- an enclosure including a direct current (DC) power supply disposed therein and adapted for enclosing a plurality of storage media and a plurality of media drives;
- on the enclosure, an airflow outlet structure through which air is drawn out from the enclosure; and
- on the enclosure, an airflow inlet structure through which the air is drawn into the enclosure, the airflow inlet structure having an electrostatic filter sub-structure, the electrostatic filter sub-structure electrically coupled with the DC power supply,
- wherein the airflow inlet structure and the airflow outlet structure define a primary airflow path through the enclosure for air filtered by the electrostatic filter sub-structure, and
- wherein the electrostatic filter sub-structure ionizes particulates in the air drawn into the enclosure via the airflow inlet structure and comprises a layer of metal plates creating a negatively charged electrical field, whereby the particulates are attracted to the metal plates.

20. The data storage library system of claim 19,
wherein the airflow inlet structure comprises a wall panel of the enclosure, wherein the electrostatic filter sub-structure is integral with the wall panel,
wherein an EMR control sub-structure comprises a plurality of perforations that are positioned to draw the air into the enclosure through the EMR control sub-structure and then through the electrostatic filter sub-structure and are sized to attenuate EMVIR leaving the enclosure to below a threshold level, and
wherein the electrostatic filter sub-structure further comprises an end filter including an activated carbon filter providing additional purification of the air drawn into the enclosure.

* * * * *

UNITED STATES PATENT AND TRADEMARK OFFICE
CERTIFICATE OF CORRECTION

PATENT NO. : 10,004,163 B2
APPLICATION NO. : 15/167747
DATED : June 19, 2018
INVENTOR(S) : Smith It is certified that error appears in the above-identified patent and that said Letters Patent is hereby corrected as shown below:

In the Specification

In Column 2, Line 40, delete "embodiments:" and insert -- embodiments; --, therefor.

In Column 3, Line 44, delete "and or" and insert -- and/or --, therefor.

In Column 9, Line 32, delete "claims." and insert -- claims, --, therefor.

In the Claims

In Column 10, Line 16, in Claim 2, delete "EMIR" and insert -- EMR --, therefor.

In Column 12, Line 44, in Claim 20, delete "EMVIR" and insert -- EMR --, therefor.

Signed and Sealed this
Twelfth Day of February, 2019

Andrei Iancu
*Director of the United States Patent and Trademark Office*